United States Patent
Kim et al.

(10) Patent No.: US 12,156,419 B2
(45) Date of Patent: Nov. 26, 2024

(54) DISPLAY APPARATUS HAVING A LIGHT-EMITTING DEVICE AND A TOUCH ELECTRODE

(71) Applicant: LG Display Co., Ltd., Seoul (KR)

(72) Inventors: Dong Yeon Kim, Seoul (KR); Hoon Kang, Goyang-si (KR); Ju Seong Park, Gimpo-si (KR); Myung Soo Park, Gimpo-si (KR); Young Min Kim, Goyang-si (KR); Se Wan Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 178 days.

(21) Appl. No.: 17/504,214

(22) Filed: Oct. 18, 2021

(65) Prior Publication Data
US 2022/0149319 A1 May 12, 2022

(30) Foreign Application Priority Data
Nov. 11, 2020 (KR) .......................... 10-2020-0150050

(51) Int. Cl.
*H10K 50/84* (2023.01)
*H10K 59/40* (2023.01)

(52) U.S. Cl.
CPC ............ *H10K 50/84* (2023.02); *H10K 59/40* (2023.02)

(58) Field of Classification Search
None
See application file for complete search history.

(56) References Cited

U.S. PATENT DOCUMENTS

| | | | | |
|---|---|---|---|---|
| 4,838,351 A * | 6/1989 | Jennings, Jr. | ............ | C09K 8/80 166/302 |
| 4,952,245 A * | 8/1990 | Iwano | .................. | C09C 1/0015 106/404 |
| 5,315,577 A * | 5/1994 | Kirino | ............... | G11B 11/10586 369/13.53 |
| 5,792,548 A * | 8/1998 | Kuwajima | ............. | G11B 5/733 428/323 |
| 2001/0033135 A1* | 10/2001 | Duggal | ................ | H10K 50/858 313/506 |
| 2006/0065989 A1* | 3/2006 | Druffel | ............ | B29D 11/00009 264/1.32 |
| 2009/0311873 A1* | 12/2009 | Wang | ................ | H01L 21/67109 438/758 |

(Continued)

FOREIGN PATENT DOCUMENTS

KR 10-2021-0083816 A 7/2021

*Primary Examiner* — Erik T. K. Peterson
*Assistant Examiner* — Christopher A. Schodde
(74) *Attorney, Agent, or Firm* — Fenwick & West LLP

(57) ABSTRACT

A display apparatus having a light-emitting device and a touch electrode is provided. An optical pattern may be disposed on the light-emitting device. A side of the optical pattern may be sloped. A surface of the optical pattern opposite to the light-emitting device may be covered by an intermediate insulating layer. The intermediate insulating layer may be harder than the optical pattern. The touch electrode may overlap the side of the optical pattern. Thus, in the display apparatus, the surface defect of the optical pattern in the forming process of the touch electrode may be prevented. Therefore, in the display apparatus, the frontal luminance and the image quality may be improved.

15 Claims, 8 Drawing Sheets

(56) References Cited

U.S. PATENT DOCUMENTS

| | | | |
|---|---|---|---|
| 2009/0323060 A1* | 12/2009 | Knipp | G01J 3/12 |
| | | | 977/773 |
| 2010/0265206 A1* | 10/2010 | Chen | G06F 3/0445 |
| | | | 345/82 |
| 2014/0117842 A1* | 5/2014 | Hanamura | H05B 33/10 |
| | | | 313/504 |
| 2015/0349291 A1* | 12/2015 | Song | H10K 50/82 |
| | | | 257/40 |
| 2018/0061898 A1* | 3/2018 | Oh | H10K 59/873 |
| 2018/0061899 A1* | 3/2018 | Oh | G06F 3/0412 |
| 2018/0138244 A1* | 5/2018 | Fukagawa | H10K 50/856 |
| 2018/0182821 A1* | 6/2018 | Yun | H10K 59/131 |
| 2019/0095019 A1* | 3/2019 | Shin | H10K 50/84 |
| 2019/0220649 A1* | 7/2019 | Zhu | H10K 59/65 |
| 2020/0119113 A1* | 4/2020 | Lee | H10K 50/8445 |
| 2020/0150847 A1* | 5/2020 | Jang | H10K 50/824 |
| 2021/0066642 A1* | 3/2021 | Lee | H10K 59/122 |
| 2021/0200357 A1* | 7/2021 | Lee | G06F 3/0443 |
| 2021/0200358 A1 | 7/2021 | Kim et al. | |
| 2021/0242423 A1* | 8/2021 | Lee | H10K 59/122 |
| 2022/0140288 A1* | 5/2022 | Ji | H10K 59/122 |
| | | | 257/91 |
| 2022/0278173 A1* | 9/2022 | Kong | H10K 59/351 |

* cited by examiner

DISPLAY APPARATUS HAVING A LIGHT-EMITTING DEVICE AND A TOUCH ELECTRODE

CROSS-REFERENCE TO RELATED APPLICATIONS

This application claims the benefit of Korean Patent Application No. 10-2020-0150050 filed on Nov. 11, 2020, which is hereby incorporated by reference as if fully set forth herein.

BACKGROUND OF THE INVENTION

Field of the Invention

The present disclosure relates to a display apparatus in which a light-emitting device and a touch structure including a touch electrode are stacked.

Discussion of the Related Art

Generally, an electronic appliance, such as a monitor, a TV, a laptop computer and a digital camera, includes a display apparatus to realize an image. For example, the display apparatus may include at least one light-emitting device. The light-emitting device may emit light displaying a specific color. For example, the light-emitting device may include a light-emitting layer disposed between a first emission electrode and a second emission electrode.

The display apparatus may reduce a viewing angle so that the image provided to user is not recognized by other people around. For example, the display apparatus may restrict a travelling direction of the light emitted from the light-emitting device by using a light control film (LCF). However, since the light control film is attached to the top layer of the display apparatus, Moire may occur due to a louver of the light control film restricting the travelling direction of the light. Thus, in the display apparatus, the quality of the image may be decreased.

SUMMARY OF THE INVENTION

Accordingly, the present disclosure is directed to a display apparatus that substantially obviates one or more problems due to limitations and disadvantages of the related art.

An object of the present disclosure is to provide a display apparatus capable of realizing a narrow viewing angle and improving the quality of the image.

Another object of the present disclosure is to provide a display apparatus to improving the frontal luminance.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising a device substrate. A light-emitting device and an encapsulating element are disposed on the device substrate. The encapsulating element covers the light-emitting device. An optical pattern is disposed on the encapsulating element. The optical pattern overlaps the light-emitting device. An intermediate insulating layer is disposed on the optical pattern. The intermediate insulating layer has hardness greater than the optical pattern. A touch electrode is disposed on a side of the optical pattern. A horizontal width of the optical pattern is decreased as its distance from the encapsulating element increases.

The intermediate insulating layer may be in contact with a surface of the optical pattern which is opposite to the device substrate.

The refractive index of the intermediate insulating layer may be smaller than the refractive index of the optical pattern.

The optical pattern may include an organic insulating material. The intermediate insulating layer may include an inorganic insulating material.

A cover insulating layer may be disposed on the intermediate insulating layer and the touch electrode. The refractive index of the cover insulating layer may be smaller than the refractive index of the intermediate insulating layer.

A side of the optical pattern may have a convex shape toward the outside of the optical pattern.

A touch pad may be disposed on the device substrate. The touch pad may be spaced away from the encapsulating element. A cover dam may be disposed on the encapsulating element. The cover dam may be disposed between the light-emitting device and the touch pad. The cover dam may include the same material as the optical pattern.

A bridge electrode may be disposed on the encapsulating element. The bridge electrode may be spaced away from the optical pattern. The intermediate insulating layer may extend on the bridge electrode. The touch electrode may be connected to the bridge electrode by penetrating the intermediate insulating layer.

In another embodiment, there is provided a display apparatus comprising a device substrate. A light-emitting device is disposed on the device substrate. An optical pattern is disposed on the light-emitting device. The optical pattern has an inclined side. An intermediate insulating layer is disposed on a surface of the optical pattern which is opposite to the light-emitting device. A touch electrode is disposed on the inclined side of the optical pattern. The intermediate insulating layer has an etch selectivity with the touch electrode.

The touch electrode may include an end which is disposed on the intermediate insulating layer.

The touch electrode may be in contact with the inclined side of the optical pattern.

An encapsulating element may be disposed between the light-emitting device and the optical pattern. A bridge electrode may be disposed on the encapsulating element. The bridge electrode may be spaced away from the optical pattern. A touch insulating layer may be disposed on the bridge electrode. The touch insulating layer may extend between the encapsulating element and the optical pattern. The touch insulating layer may include a touch contact hole exposing a portion of the bridge electrode. The touch electrode may be connected to the bridge electrode through the touch contact hole.

A cover insulating layer may be disposed on the intermediate insulating layer and the touch electrode. A touch pad may be disposed on the device substrate. The touch pad may be spaced away from the touch cover insulating layer. A cover dam may be disposed between the touch pad and the cover insulating layer. The touch electrode may be connected to the touch pad by a link line. The link line may extend along a surface of the cover dam. The cover dam may have a stacked structure of a first dam pattern and a second dam pattern. The first dam pattern may include the same material as the optical pattern. The second dam pattern may include the same material as the intermediate insulating layer.

The thickness of the first dam pattern may be the same as the thickness of the optical pattern. The thickness of the second dam pattern may be the same as the thickness of the intermediate insulating layer.

A side of the first dam pattern may have an inclination angle different from the inclined side of the optical pattern.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
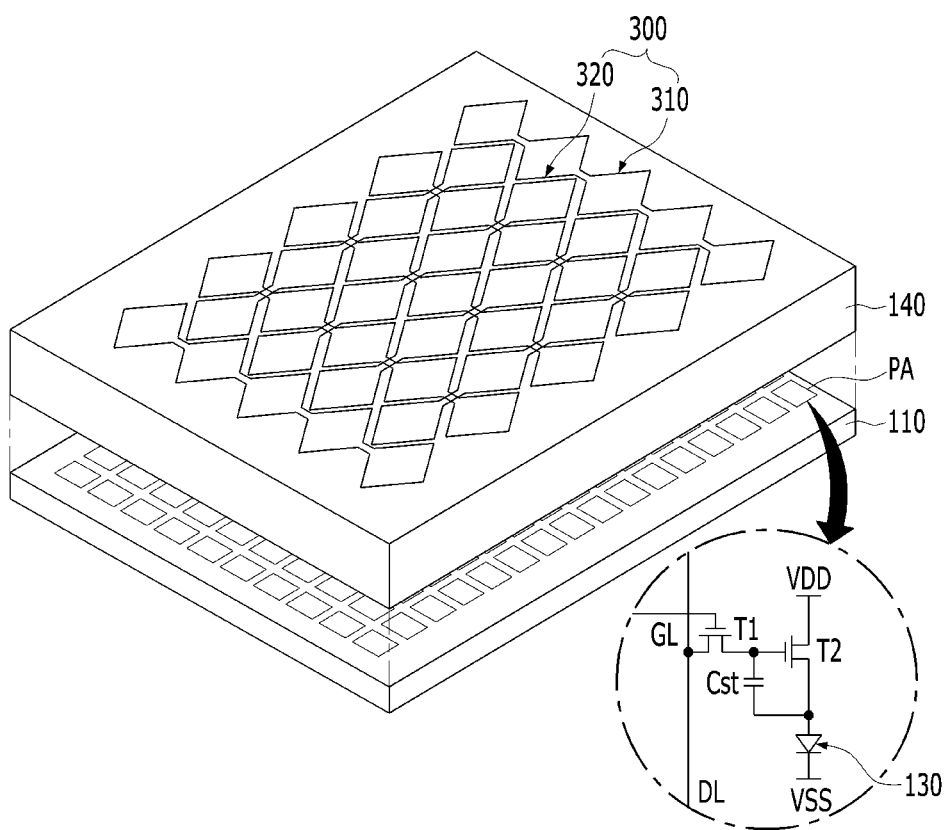
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
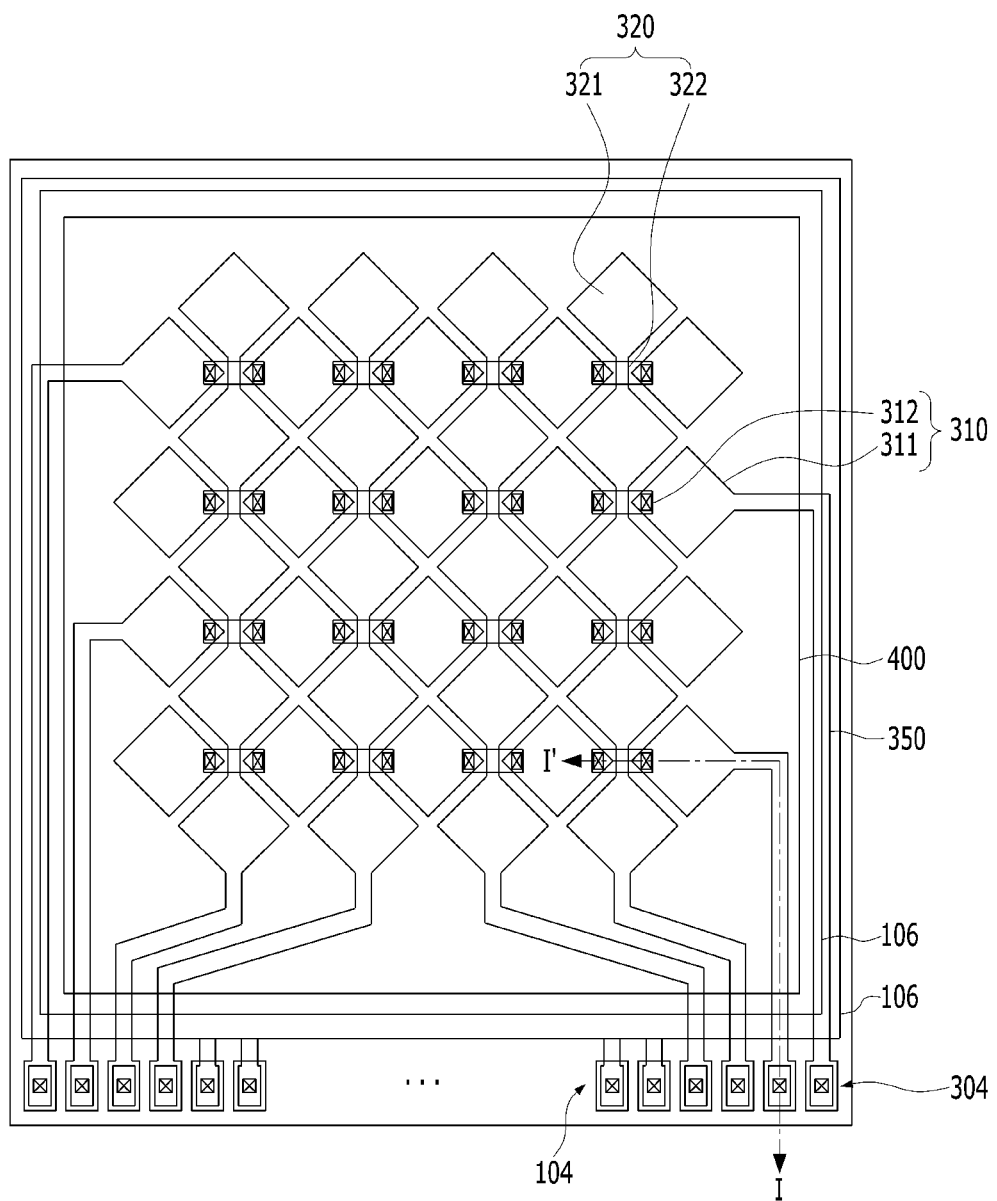
FIG. 2 is a view showing a top surface of the display apparatus according to the embodiment of the present disclosure.
Figure 3:
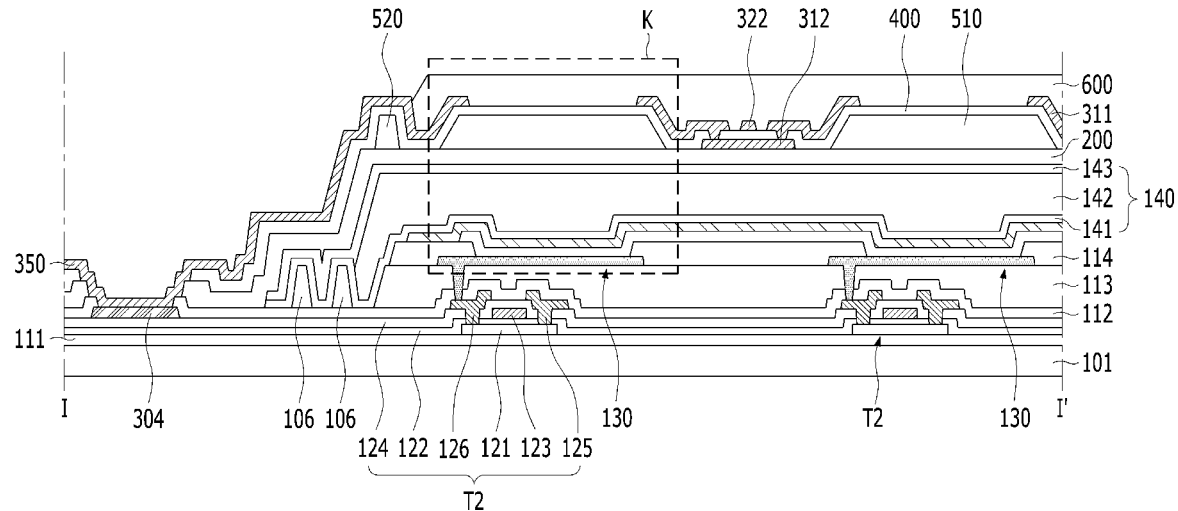
FIG. 3 is a view taken along I-I' of FIG. 2.
Figure 4:
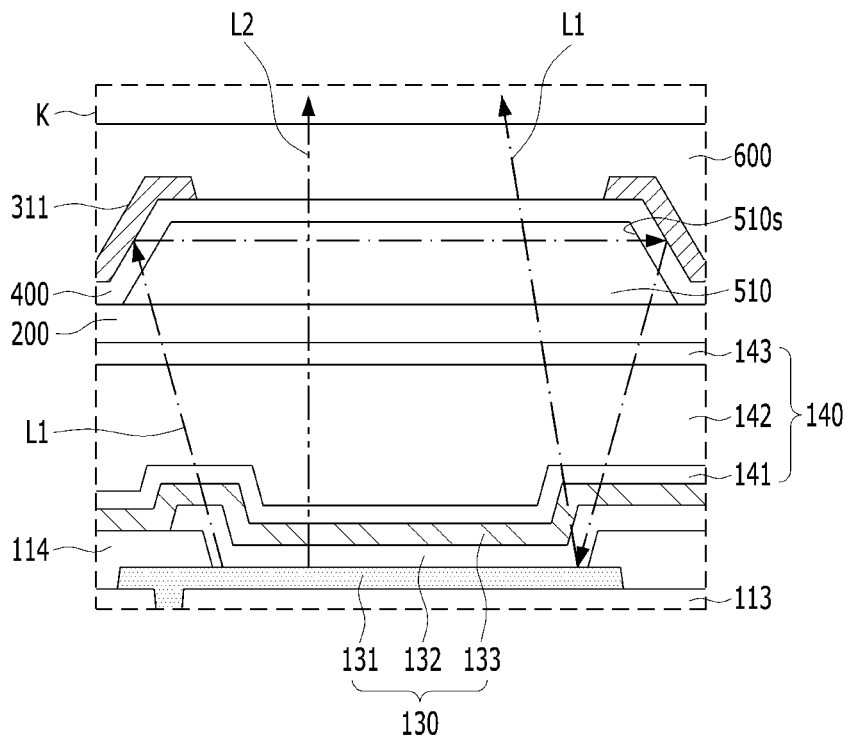
FIG. 4 is an enlarged view of K region in FIG. 3.

FIG. 1 is a view schematically showing a display apparatus according to an embodiment of the present disclosure. FIG. 2 is a view showing a top section of the display apparatus according to the embodiment of the present disclosure. FIG. 3 is a view taken along I-I' of FIG. 2. FIG. 4 is an enlarged view of K region in FIG. 3.

Referring to FIGS. 1 to 4, the display apparatus according to embodiment of the present disclosure may include a device substrate 110. The device substrate 110 may include an insulating material. For example, the device substrate 110 may include glass or plastic.

Signal wires GL, DL, VDD and VSS may be disposed on the device substrate 110. The signal wires GL, DL, VDD and VSS may transmit various signals to realize an image. For example, the signal wires GL, DL, VDD and VSS may include a gate line GL applying a gate signal, a data line DL applying a data signal, and a power voltage supply line supplying a power voltage VDD and VSS.

Pixel areas PA may be disposed among the signal wires GL, DL, VDD and VSS. A driving circuit connected to the signal wires GL, DL, VDD and VSS, and a light-emitting device 130 connected to the driving circuit may be disposed in each pixel area PA. The driving circuit of each pixel area PA may supply a driving current corresponding to the data signal to the light-emitting device 130 of the corresponding pixel area PA according to the gate signal during one frame. For example, the driving circuit of each pixel area PA may include a first thin film transistor T1, a second thin film transistor T2 and a storage capacitor Cst.

The first thin film transistor T1 may transmit the data signal to the second thin film transistor T2 according to the gate signal. The second thin film transistor T2 may generate the driving current corresponding to the data signal. For example, the second thin film transistor T2 may include a semiconductor pattern 121, a gate insulating layer 122, a gate electrode 123, an interlayer insulating layer 124, a source electrode 125 and a drain electrode 126.

The semiconductor pattern 121 may include a semiconductor material. For example, the semiconductor pattern 121 may include amorphous-Si or poly-Si. The semiconductor pattern 121 may be an oxide semiconductor. For example, the semiconductor pattern 121 may include a metal oxide, such as IGZO. The semiconductor pattern 121 may include a source region, a drain region and a channel region. The channel region may be disposed between the source region and the drain region. The source region and the drain region may have a resistance lower than the channel region.

The gate insulating layer 122 may be disposed on the semiconductor pattern 121. The gate insulating layer 122 may extend beyond the semiconductor pattern 121. For example, a side of the semiconductor pattern 121 may be covered by the gate insulating layer 122. The gate insulating layer 122 may include an insulating material. For example, the gate insulating layer 122 may include silicon oxide (SiO) or silicon nitride (SiN). The gate insulating layer 122 may include a material having high dielectric constant. For example, the gate insulating layer 122 may include a High-K material, such as hafnium oxide (HfO). The gate insulating layer 122 may have a multi-layer structure.

The gate electrode 123 may be disposed on the gate insulating layer 122. For example, the gate insulating layer 122 may be disposed between the semiconductor pattern 121 and the gate electrode 123. The gate electrode 123 may be insulated from the semiconductor pattern 121 by the gate insulating layer 122. The gate electrode 123 may include a conductive material. For example, the gate electrode 123 may include a metal, such as aluminum (Al), titanium (Ti), copper (Cu), chrome (Cr), molybdenum (Mo) and tungsten (W). The gate electrode 123 may overlap the channel region of the semiconductor pattern 121. For example, the channel region of the semiconductor pattern 121 may have electrical conductivity corresponding to a voltage applied to the gate electrode 123.

The interlayer insulating layer 124 may be disposed on the gate electrode 123. The interlayer insulating layer 124 may extend beyond the gate electrode 123. For example, a side of the gate electrode 123 may be covered by the interlayer insulating layer 124. The interlayer insulating layer 124 may include an insulating material. For example, the interlayer insulating layer 124 may include silicon oxide (SiO).

The source electrode 125 may be disposed on the interlayer insulating layer 124. The source electrode 125 may include a conductive material. For example, the source electrode 125 may include a metal, such as aluminum (Al), titanium (Ti), copper (Cu), chrome (Cr), molybdenum (Mo) and tungsten (W). The source electrode 125 may include a material different from the gate electrode 123. The source electrode 125 may be electrically connected to the source region of the semiconductor pattern 121. For example, the gate insulating layer 122 and the interlayer insulating layer 124 may include a source contact hole partially exposing the source region of the semiconductor pattern 121. The source electrode 125 may be in direct contact with the source region of the semiconductor pattern 121 within the source contact hole.

The drain electrode 126 may be disposed on the interlayer insulating layer 124. The drain electrode 126 may include a conductive material. For example, the drain electrode 126 may include a metal, such as aluminum (Al), titanium (Ti), copper (Cu), chrome (Cr), molybdenum (Mo) and tungsten (W). The drain electrode 126 may include the same material as the source electrode 125. For example, the drain electrode 126 may include a material different from the gate electrode 123. The drain electrode 126 may be electrically connected to the drain region of the semiconductor pattern 121. The drain electrode 126 may be spaced away from the source electrode 125. For example, the gate insulating layer 122 and the interlayer insulating layer 124 may include a drain contact hole partially exposing the drain region of the semiconductor pattern 121. The drain electrode 126 may be in direct contact with the drain region of the semiconductor pattern 121 within the drain contact hole.

The first thin film transistor T1 may have a stacked structure same as the second thin film transistor T2. For example, the first thin film transistor T1 may include a gate electrode connected to the gate line GL and a source electrode connected to the date line DL. The gate electrode 123 of the second thin film transistor T2 may be connected to a drain electrode of the first thin film transistor T1. A semiconductor pattern of the first thin film transistor T1 may include the same material as the semiconductor pattern 121 of the second thin film transistor T2.

The storage capacitor Cst may maintain the operation of the second thin film transistor T2 during one frame. For example, the storage capacitor Cst may be connected between the gate electrode 123 and the drain electrode 126 of the second thin film transistor T2.

A device buffer layer 111 may be disposed between the device substrate 110 and the driving circuit of each pixel area PA. The device buffer layer 111 may prevent pollution due to the device substrate 110 in a process of forming the driving circuit of each pixel area PA. For example, a surface of the device substrate 110 toward the driving circuit of each pixel area PA may be completely covered by the device buffer layer 111. The device buffer layer 111 may include an insulating material. For example, the device buffer layer 111 may include silicon oxide (SiO) and/or silicon nitride (SiN). The device buffer layer 111 may have a multi-layer structure.

A lower passivation layer 112 on the driving circuit of each pixel area PA. The lower passivation layer 112 may prevent the damage of the driving circuit of each pixel area PA due to external impact and moisture. For example, the first thin film transistor T1, the second thin film transistor T2 and the storage capacitor Cst of each pixel area PA may be completely covered by the lower passivation layer 112. The lower passivation layer 112 may include an insulating material. For example, the lower passivation layer 112 may include silicon oxide (SiO) and/or silicon nitride (SiN).

An over-coat layer 113 may be disposed on the lower passivation layer 112. The over-coat layer 113 may remove a difference in thickness due to the driving circuit of each pixel area PA. For example, a surface of the over-coat layer 113 which is opposite to the device substrate 110 may be a flat surface. The over-coat layer 113 may include an insulating material. The over-coat layer 113 may include a material different from the lower passivation layer 112. For example, the over-coat layer 113 may include an organic insulating material.

The light-emitting device 130 of each pixel area PA may be disposed on the over-coat layer 113. The light-emitting device 130 may emit light displaying a specific color. For example, the light-emitting device 130 may include a first emission electrode 131, a light-emitting layer 132 and a second emission electrode 133, which are sequentially stacked on the over-coat layer 113.

The first emission electrode 131 may include a conductive material. The first emission electrode 131 may include a material having high reflectance. For example, the first emission electrode 131 may include a metal, such as aluminum (Al) and silver (Ag). The first emission electrode 131 may have a multi-layer structure. For example, the first emission electrode 131 may have a structure in which a reflective electrode formed of a metal is disposed between transparent electrodes formed of a transparent conductive material, such as ITO.

The light-emitting layer 132 may generate light having luminance corresponding to a voltage difference between the first emission electrode 131 and the second emission electrode 133. For example, the light-emitting layer 132 may include an emission material layer (EML) having an emission material. The emission material may include an organic material, an inorganic material or a hydride material. For example, the display apparatus according to the embodiment of the present disclosure may be an organic light-emitting display apparatus including the light-emitting layer 132 formed of an organic material. The light-emitting layer 132 may have a multi-layer structure. For example, the light-emitting layer 132 may further include at least one of a hole injection layer (HIL), a hole transmitting layer (HTL), an electron transmitting layer (ETL) and an electron injection layer (EIL). Thus, in the display apparatus according to the embodiment of the present disclosure, the luminous efficiency may be improved.

The second emission electrode 133 may include a conductive material. The second emission electrode 133 may include a material different from the first emission electrode 131. The transparency of the second emission electrode 133 may be higher than the transparency of the first emission electrode 131. For example, the second emission electrode 133 may be a transparent electrode consisting of a transparent conductive material, such as ITO. Thus, in the display apparatus according to the embodiment of the present disclosure, the light generated by the light-emitting layer 132 of each pixel area PA may be emitted to the outside through the second emission electrode 133 of the corresponding pixel area PA.

The light-emitting device 130 of each pixel area PA may be electrically connected to the drain electrode 126 of the second thin film transistor T2 which is disposed in the corresponding pixel area PA. For example, the lower passivation layer 112 and the over-coat layer 113 may include electrode contact holes partially exposing the drain electrode 126 of the second thin film transistor T2 in each pixel area PA. The first emission electrode 131 of each pixel area PA may be electrically connected to the drain electrode 126 of the second thin film transistor T2 in the corresponding pixel area PA through one of the electrode contact holes.

A bank insulating layer 114 may be disposed on the over-coat layer 113. The bank insulating layer 114 may include an insulating material. For example, the bank insulating layer 114 may include an organic insulating material. The bank insulating layer 114 may include a material different from the over-coat layer 113. The bank insulating layer 114 may define an emission region in each pixel area PA. For example, an edge of the first emission electrode 131 in each pixel area PA may be covered by the bank insulating layer 114. The light-emitting layer 132 and the second emission electrode 133 in each pixel area PA may be stacked on a portion of the first emission electrode 131 exposed by the bank insulating layer 114 in the corresponding pixel area PA. Thus, in the display apparatus according to the embodiment of the present disclosure, the light-emitting device 130 of each pixel area PA may be controlled, independently.

The second emission electrode 133 of each pixel area PA may extend on the bank insulating layer 114. For example, the second emission electrode 133 of each pixel area PA may be connected to the second emission electrode 133 of adjacent pixel area PA. Therefore, in the display apparatus according to the embodiment of the present disclosure, the luminance of each pixel area PA may be controlled by the data signal.

An encapsulating element 140 may be disposed on the light-emitting device 130 of each pixel area PA. The encapsulating element 114 may prevent the damage of the light-emitting devices 130 due to the external impact and moisture. The encapsulating element 114 may extend beyond each pixel area PA. For example, the driving circuit and the light-emitting device 130 of each pixel area PA may be completely covered by the encapsulating element 140.

The encapsulating element 140 may have a multi-layer structure. For example, the encapsulating element 140 may include a first encapsulating layer 141, a second encapsulating layer 142 and a third encapsulating layer 143, which are sequentially stacked on the device substrate 110. The first encapsulating layer 141, the second encapsulating layer 142 and the third encapsulating layer 143 may include an insulating material. The second encapsulating layer 142 may include a material different from the first encapsulating layer 141 and the third encapsulating layer 143. For example, the first encapsulating layer 141 and the third encapsulating layer 143 may include an inorganic insulating material, and the second encapsulating layer 142 may include an organic insulating material. Thus, in the display apparatus according to the embodiment of the present disclosure, the damage of the light-emitting device 130 due to the external impact and moisture may be effectively prevented. A thickness difference due to the light-emitting device 130 of each pixel area PA may be removed by the encapsulating element 140. For example, a surface of the encapsulating element 140 which is opposite to the device substrate 110 may be a flat surface.

At least one encapsulation dam 106 may be disposed outside the over-coat layer 113 and the bank insulating layer 114. The encapsulation dam 106 may extend along an edge of the device substrate 110. For example, the encapsulation dam 106 may have a closed loop shape surrounding a portion of the device substrate 110. The encapsulation dam 106 may block the flow of the second encapsulating layer 142 having a relatively high fluidity. For example, the second encapsulating layer 142 may be disposed on the portion of the device substrate 110 which is defined by the encapsulation dam 106. The first encapsulating layer 141 and the third encapsulating layer 143 may extend along a surface of the encapsulation dam 106. For example, the third encapsulating layer 143 may be in direct contact with the first encapsulating layer 141 at the outside of the encapsulation dam 106.

The encapsulation dam 106 may include an insulating material. For example, the encapsulation dam 106 may include an organic insulating material. The encapsulation dam 106 may be disposed on the lower passivation layer 112. For example, the encapsulation dam 106 may be formed simultaneously with the over-coat layer 113. The encapsulation dam 106 may include the same material as the over-coat layer 113. Thus, in the display apparatus according to the embodiment of the present disclosure, the process efficiency may be improved.

A touch structure 300 may be disposed on the encapsulating element 140. The touch structure 300 may detect a touch of user and/or tool. For example, the touch structure 300 may include touch electrodes 311 and 321 and bridge electrodes 312 and 322 connecting between the touch electrodes 311 and 321. The touch electrodes 311 and 321 may be disposed side by side. The bridge electrodes 312 and 322 may connect between the touch electrodes 311 and 321. A touch buffer layer 200 may be disposed between the encapsulating element 140 and the touch structure 300. The touch buffer layer 200 may prevent the damage of the light-emitting device 130 in a process of forming the touch electrodes 311 and 321 and the bridge electrodes 312 and 322. For example, a surface of the encapsulating element 140 toward the touch structure 300 may be completely covered by the touch buffer layer 200. The touch buffer layer 200 may extend along the third encapsulating layer 143. For example, the touch buffer layer 200 may extend beyond the encapsulation dam 106. The touch buffer layer 200 may include an insulating material. For example, the touch buffer layer 200 may include silicon oxide (SiO) and/or silicon nitride (SiN).

The touch electrodes 311 and 321 and the bridge electrodes 312 and 322 may include a conductive material. The touch electrodes 311 and 321 and the bridge electrodes 312 and 322 may include a material having low resistance. For example, the touch electrodes 311 and 321 and the bridge electrode 312 and 322 may include a metal, such as aluminum (Al), copper (Cu), titanium (Ti), molybdenum (Mo) and tungsten (W). The touch electrodes 311 and 321 and the bridge electrodes 312 and 322 may have a high reflectance. For example, the light emitted toward the touch electrodes 311 and 321 or the bridge electrodes 312 and 322 from the light-emitting device 130 of each pixel area PA may be reflected by the touch electrodes 311 and 321 and the bridge electrodes 312 and 322.

The bridge electrodes 312 and 322 may be spaced away from the light-emitting device 130 of each pixel area PA. For example, the bridge electrodes 312 and 322 may overlap the bank insulating layer 114. Each of the touch electrodes 311 and 321 may include a portion overlapping with the bank insulating layer 114. The light-emitting device 130 of each pixel area PA may be disposed between the touch electrodes 311 and 321 and the bridge electrodes 312 and 322. That is, in the display apparatus according to the embodiment of the present disclosure, the travelling direction of the light emitted from the light-emitting device 130 of each pixel area PA may be restricted by the touch electrodes 311 and 321 and the bridge electrodes 312 and 322. Thus, in the display apparatus according to the embodiment of the present disclosure, the narrow viewing angle may be realized by the touch electrodes 311 and 321 and the bridge electrodes 312 and 322.

The touch structure 300 may comprise a first touch assembly 310 including the touch electrodes 311 and 321 which are connected by the bridge electrodes 312 and 322 in a first direction, and a second touch assembly 320 including the touch electrodes 311 and 321 which are connected by the bridge electrodes 312 and 322 in a second direction perpendicular to the first direction. For example, the first touch assembly 310 may include first touch electrodes 311 disposed side by side and first bridge electrodes 312 connecting the first touch electrodes 311 in the first direction, and the second touch assembly 320 may include second touch electrodes 321 disposed between the first touch electrodes 311 and second bridge electrodes 322 connecting the second touch electrodes 321 in the second direction. Each of the second bridge electrodes 322 may cross one of the first bridge electrodes 312. The second bridge electrodes 322 may be insulated from the first bridge electrodes 312. The second bridge electrodes 322 may be disposed on a layer different from the first bridge electrodes 312. For example, an intermediate insulating layer 400 may be disposed between the first bridge electrodes 312 and the second bridge electrodes 322. The intermediate insulating layer 400 may include an insulating material. For example, the intermediate insulating layer 400 may include an inorganic insulating material, such as silicon oxide (SiO) and silicon nitride (SiN).

The second touch electrodes 321 may be disposed on the same layer as the first touch electrodes 311. For example, the intermediate insulating layer 400 may cover the first bridge electrodes 312, and the first touch electrodes 311, the second touch electrodes 321 and the second bridge electrodes 322 may be disposed on the intermediate insulating layer 400. The intermediate insulating layer 400 may include touch contact holes partially exposing each first bridge electrode 312. Each of the first touch electrodes 311 may be connected to the corresponding first bridge electrode 312 by one of the touch contact holes.

Optical patterns 510 may be disposed between the touch buffer layer 200 and the intermediate insulating layer 400. A lower surface of each optical pattern 510 toward the device substrate 110 may be in direct contact with the touch buffer layer 200. For example, an upper surface and a side of each optical pattern 510 which are opposite to the device substrate 110 may be covered by the intermediate insulating layer 400. Each of the optical patterns 510 may be disposed on a path of the light emitted from one of the light-emitting devices 130. For example, the optical patterns 510 may overlap the light-emitting devices 130. The light emitted from each light-emitting device 130 may be emitted to the outside through the corresponding optical pattern 510 and the intermediate insulating layer 400.

A horizontal width of each optical pattern 510 may be decreased as its distance from the encapsulating element 140 increases. For example, a side 510e of each optical pattern 510 may have a positive taper inclination. An inclined side 510e of each optical pattern 510 may overlap the touch electrodes 311 and 321. For example, each of the touch electrodes 311 and 321 may include a portion which is disposed on the inclined side 510e of one of the optical patterns 510. Thus, in the display apparatus according to the embodiment of the present disclosure, the light L1 emitted toward the inclined side 510e of the corresponding optical pattern 510 from each light-emitting device 130 may be reflected by the touch electrodes 311 and 321. Therefore, in the display apparatus according to the embodiment of the present disclosure, the color mixing due to the light emitted from each light-emitting device 130 toward adjacent pixel area PA may be prevented.

The light reflected by the touch electrodes 311 and 321 may be reflected by the first emission electrode 131 of the corresponding light-emitting device 130 toward the upper surface of the corresponding optical pattern 510. The light L2 emitted toward the upper surface of the corresponding optical pattern 510 from each light-emitting device 130 may pass between the touch electrodes 311 and 321. The upper surface of each optical pattern 510 may have a size larger than a portion of the corresponding first emission electrode 131 which is exposed by the bank insulating layer 114. For example, a portion of the upper surface of each optical pattern 510 which is exposed by the touch electrodes 311 and 321 covering the inclined side 510e of the corresponding optical pattern 510 may have the same size as the portion of the corresponding first emission electrode 131, substantially. Thus, in the display apparatus according to the embodiment of the present disclosure, the light extraction efficiency and the frontal luminance of each pixel area PA may be improved.

The optical patterns 510 may include an insulating material. The optical patterns 510 may include a transparent material. For example, the optical patterns 510 may include an organic insulating material. The thickness of each optical pattern 510 may be larger than the thickness of the intermediate insulating layer 520. Thus, in the display apparatus according to the embodiment of the present disclosure, the inclination angle of the side 510e of each optical pattern 510 may be easily adjusted. Therefore, in the display apparatus according to the embodiment of the present disclosure, the process efficiency may be improved.

The hardness of the intermediate insulating layer 400 may be greater than the hardness of each optical pattern 510. The intermediate insulating layer 400 may include a material harder than the optical patterns 510. For example, the optical patterns 510 may include an organic insulating material, and the intermediate insulating layer 400 may include an inorganic insulating material. The intermediate insulating layer 400 may have an etch selectivity with the touch electrodes 311 and 321. Thus, in the display apparatus according to the embodiment of the present disclosure, the damage of the intermediate insulating layer 400 in a process of forming the touch electrodes 311 and 321 may be prevented. That is, in the display apparatus according to the embodiment of the present disclosure, a surface roughness of the intermediate insulating layer 400 may be not increased by the process of forming the touch electrodes 311 and 321. Therefore, in the display apparatus according to the embodiment of the present disclosure, scattering of the light due to the surface roughness of the portion of the intermediate insulating layer 400 which overlaps each light-emitting device 130 may be minimized.

The refractive index of the intermediate insulating layer 400 may be smaller than the refractive index of the optical patterns 510. Thus, in the display apparatus according to the embodiment of the present disclosure, the light incident at a specific angle or less on the upper surface of each optical pattern 510 may be totally reflected. That is, in the display apparatus according to the embodiment of the present disclosure, the light incident at a specific angle or less on the upper surface of each optical pattern 510 may be reflected toward the inside of the corresponding optical pattern 510. Therefore, in the display apparatus according to the embodiment of the present disclosure, the frontal luminance of each pixel area PA may be improved, and the mixing of the light emitted from adjacent pixel areas PA may be prevented.

Pads 104 and 304 for connecting the signal wires GL, DL, VDD and VSS and the touch structure 300 to the outside may be disposed on the device substrate 110. For example, the pads 104 and 304 may include signal pads 104 electrically connected to the signal wires GL, DL, VDD and VSS, and touch pads 304 electrically connected to the touch electrodes 311 and 321. The pads 104 and 304 may be disposed outside the encapsulation dam 106. For example, the pads 104 and 304 may be spaced away from the encapsulating element 140.

Each of the touch electrodes 311 and 321 may be connected to the corresponding touch pad 304 by one of link lines 350. The link lines 350 may include a conductive material. For example, the link lines 350 may include the same material as the touch electrodes 311 and 321. The link lines 350 may be disposed on the same layer as the touch electrodes 311 and 321. For example, the link lines 350 may be disposed on the intermediate insulating layer 400. The touch buffer layer 200 and the intermediate insulating layer 400 may include pad contact holes exposing a portion of each touch pad 304. Each of the link lines 350 may be connected to the corresponding touch pad 304 through one of the pad contact holes.

A cover insulating layer 600 may be disposed on the touch structure 300 and the intermediate insulating layer 400. The cover insulating layer 600 may prevent the damage of the touch structure 300 due to the external impact and moisture. The cover insulating layer 600 may include an insulating material. For example, the cover insulating layer 600 may include an organic insulating material. The cover insulating layer 600 may have the refractive index lower than the intermediate insulating layer 400. Thus, in the display apparatus according to the embodiment of the present disclosure, the frontal luminance may be effectively improved. And, in the display apparatus according to the embodiment of the present disclosure, the color mixing may be effectively prevented.

A cover dam 520 may be disposed between the encapsulating element 140 and the intermediate insulating layer 400. The cover dam 520 may be disposed between the touch pad 304 and the optical patterns 510. For example, the cover dam 520 may be disposed on the encapsulating element 140 between the touch pad 304 and the light-emitting devices 130. The cover dam 520 may extend along an edge of the device substrate 110. For example, the cover dam 520 may have a closed loop shape surrounding a portion of the device substrate 110. The cover insulating layer 600 may be formed on the portion of the device substrate 110 which is defined by the cover dam 520. Thus, in the display apparatus according to the embodiment of the present disclosure, the degree of freedom for a process of forming the cover insulating layer 600 may be improved.

The cover dam 520 may include an insulating material. For example, the cover dam 520 may include the same material as the optical patterns 510. The thickness of the cover dam 520 may be the same as the thickness of each optical pattern 510. For example, the cover dam 520 may be formed simultaneously with the optical patterns 510. Thus, in the display apparatus according to the embodiment of the present disclosure, the process efficiency may be improved.

A side of the cover dam 520 may have an inclination angle different from the inclined side of each optical pattern 510. For example, a side inclination of the cover dam 520 with respect to a surface of the touch buffer layer 200 may be greater than a side inclination of each optical pattern 510. Thus, in the display apparatus according to the embodiment of the present disclosure, an area occupied by the cover dam 520 may be minimized. Therefore, in the display apparatus according to the embodiment of the present disclosure, the process efficiency, the light extraction efficiency and the frontal luminance may be improved.

FIGS. 5A to 5F are views sequentially showing a method of forming the display apparatus according to the embodiment of the present disclosure.

Figure 5A:
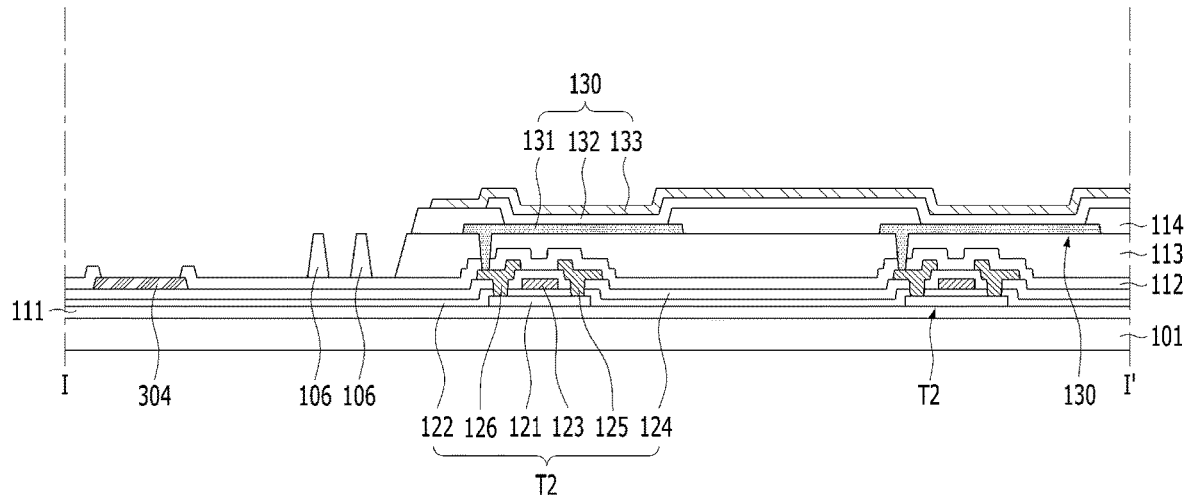
FIGS. 5A to 5F are views sequentially showing a method of forming the display apparatus according to the embodiment of the present disclosure.

A method of forming the display apparatus according to the embodiment of the present disclosure will be described with reference to FIGS. 3, 4 and 5A to 5F. First, as shown in FIG. 5A, the method of forming the display apparatus according to the embodiment of the present disclosure may include a step of forming a device buffer layer 111 on a device substrate 110, a step of forming driving circuits including a second thin film transistor T2 and pads including touch pads 304 on the device substrate 110 in which the device buffer layer 111 is formed, a step of forming a lower passivation layer 112 on the device substrate 110 in which the driving circuits and the pads, a step of forming an over-coat layer 113 and at least one encapsulation dam 106 on the lower passivation layer 112, and a step of forming light-emitting devices 130 and a bank insulating layer 114 on the over-coat layer 113.

Each of the light-emitting devices 130 may include a first emission electrode 131, a light-emitting layer 132 and a second emission electrode 133, which are stacked on the over-coat layer 113. The encapsulation dam 106 may be formed outside the over-coat layer 113. For example, the encapsulation dam 106 may be spaced away from the over-coat layer 113. The encapsulation dam 106 may be formed of the same material as the over-coat layer 113. For example, the encapsulation dam 106 may be formed simultaneously with the over-coat layer 113.

Figure 5B:
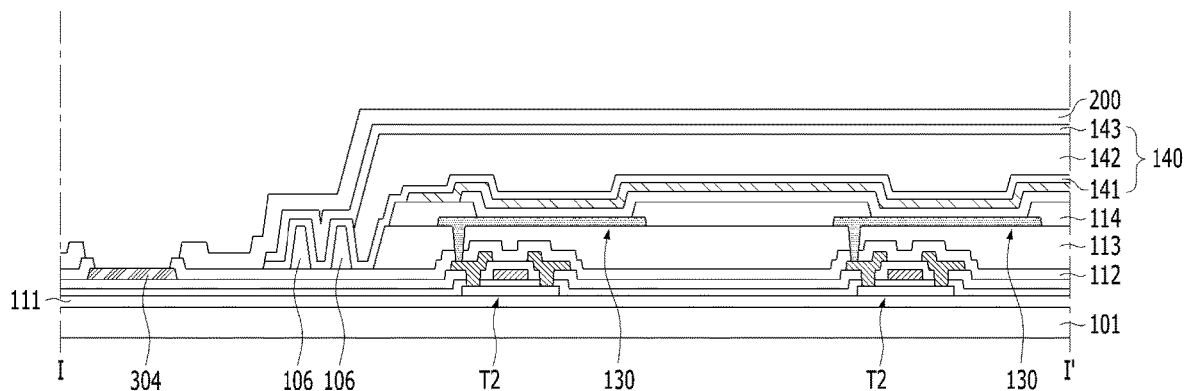

As shown in FIG. 5B, the method of forming the display apparatus according to the embodiment of the present disclosure may include a step of forming an encapsulating element 140 covering the light-emitting devices 140 and the bank insulating layer 114 on the device substrate 110, and a step of forming a touch buffer layer 200 on the encapsulating element 140.

The step of forming the encapsulating element 140 may include a step of forming a first encapsulating layer 141, a step of forming a second encapsulating layer 142 on the first encapsulating layer 141, and a step of forming a third encapsulating layer 143 on the second encapsulating layer 142. The first encapsulating layer 141, the second encapsulating layer 142 and the third encapsulating layer 143 may be formed of an insulating material. The second encapsulating layer 142 may be formed of a material different from the first encapsulating layer 141 and the third encapsulating layer 143. For example, the first encapsulating layer 141 and the third encapsulating layer 143 may be formed of an inorganic insulating material, and the second encapsulating layer 142 may be formed of an organic insulating material.

The flow of the second encapsulating layer 142 may be blocked by the encapsulation dam 106. For example, the third encapsulating layer 143 may be in direct contact with the first encapsulating layer 141 outside the encapsulation dam 106. The second encapsulating layer 142 may be completely surrounded by the first encapsulating layer 141 and the third encapsulating layer 143.

The touch buffer layer 200 may be formed of an insulating material. The touch buffer layer 200 may extend along the third encapsulating layer 143. For example, the touch buffer layer 200 may expose a portion of the touch pads 304.

Figure 5C:
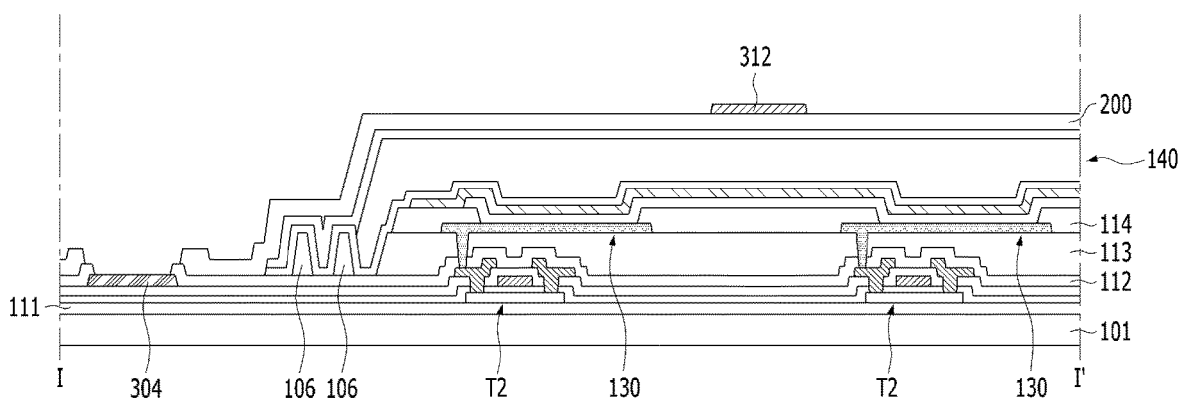

As shown in FIG. 5C, the method of forming the display apparatus according to the embodiment of the present disclosure may include a step of forming first bridge electrodes 312 on the touch buffer layer 200.

The first bridge electrodes 312 may be formed of a conductive material. For example, the first bridge electrodes 312 may be formed of a metal. The first bridge electrodes 312 may be formed on the bank insulating layer 114. Thus, in the method of forming the display apparatus according to the embodiment of the present disclosure, the light emitted from each light-emitting device 130 in a direction perpendicular to a surface of the device substrate 110 may be not blocked by the first bridge electrodes 312.

Figure 5D:
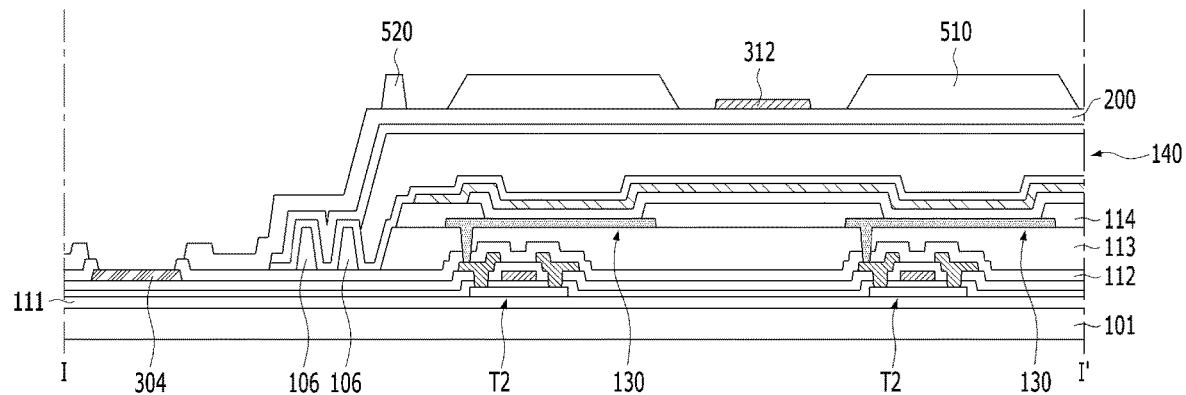

As shown in FIG. 5D, the method of forming the display apparatus according to the embodiment of the present disclosure may include a step of forming optical patterns 510 and a cover dam 520 on the device substrate 110 in which the first bridge electrodes 312 are formed.

The optical patterns 510 may be formed on the light-emitting devices 130. For example, each of the optical patterns 510 may overlap one of the light-emitting devices 130. The optical patterns 510 may be formed of an insulating material. The optical patterns 510 may be formed of a transparent material. For example, the optical pattern 510 may be formed of an organic insulating material.

Each of the optical patterns 510 may include an inclined side. An upper surface of each optical pattern 510 opposite to the device substrate 110 may be a flat surface. For example, each of the optical patterns 510 may have a trapezoidal shape. The first bridge electrodes 312 may be spaced away from the optical patterns 510.

The cover dam 520 may be formed between the light-emitting devices 130 and the touch pads 304. For example, the optical patterns 510 may be formed at the inside of the cover dam 520. The cover dam 520 may be formed of an insulating material. For example, the cover dam 520 may be formed of the same material as the optical patterns 510. The cover dam 520 may be formed simultaneously with the optical patterns 510. For example, the step of the optical patterns 510 and the cover dam 520 may include a step of forming an insulating material layer on the device substrate 110 in which the first bridge electrodes 312 are formed, and a step of patterning the insulating material layer.

A side of the cover dam 520 may have an inclination angle different from a side of each optical pattern 510. For example, the side of each optical pattern 510 may be formed more gently than the side of the cover dam 520. Thus, in the method of forming the display apparatus according to the embodiment of the present disclosure, a size occupied by the cover dam 520 may be minimized. That is, in the method of forming the display apparatus according to the embodiment of the present disclosure, an inclined side of the optical patterns 510 may be formed regardless of the cover dam 520. Therefore, in the method of forming the display apparatus according to the embodiment of the present disclosure, the process efficiency may be improved.

Figure 5E:
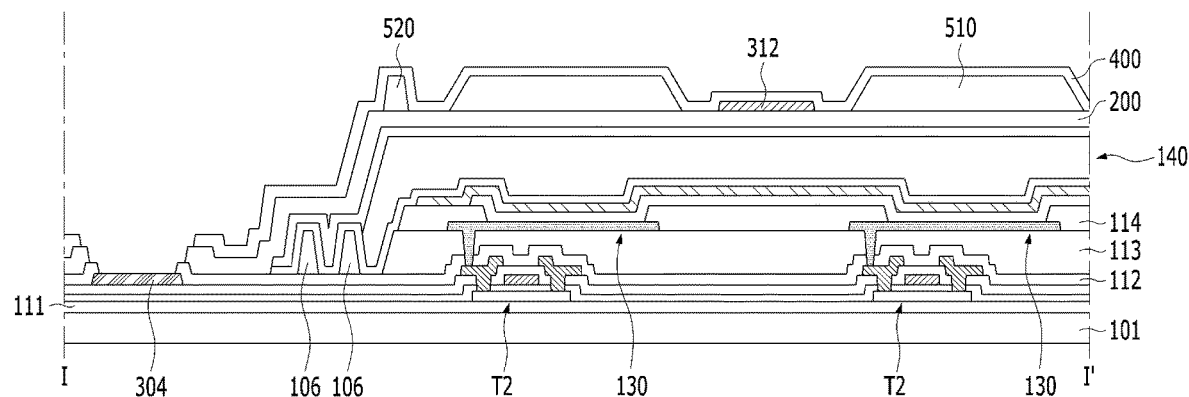

AS shown in FIG. 5E, the method of forming the display apparatus according to the embodiment of the present disclosure may include a step of forming an intermediate insulating layer 400 on the device substrate 110 in which the optical patterns 510 and the cover dam 520 are formed.

The intermediate insulating layer 400 may be formed of an insulating material. The intermediate insulating layer 400 may be formed a material harder than the optical patterns 510. For example, the intermediate insulating layer 400 may be formed of an inorganic insulating material. The intermediate insulating layer 400 may be formed to have the refractive index lower than the optical patterns 510. For example, the intermediate insulating layer 400 may be formed by a low-temperature process.

The intermediate insulating layer 400 may extend along the touch buffer layer 200. For example, the intermediate insulating layer 400 may expose the portion of each touch pad 304 exposed by the touch buffer layer 200. A pad contact hole penetrating the touch buffer layer 200 and the intermediate insulating layer 400 may be formed on the portion of each touch pad 304.

Figure 5F:
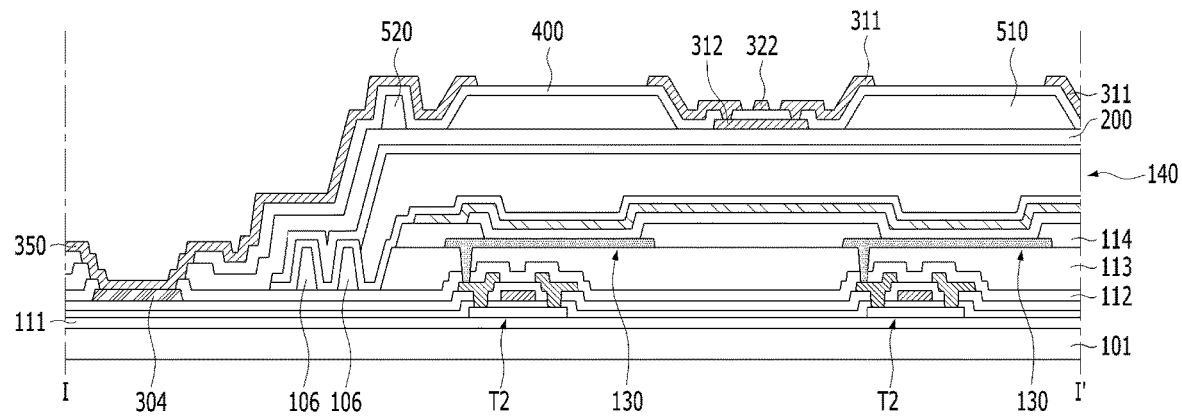

As shown in FIG. 5F, the method of forming the display apparatus according to the embodiment of the present disclosure may include a step of first touch electrodes 311, second touch electrodes, second bridge electrodes 322 and link lines 350 on the device substrate 110 in which the intermediate insulating layer 400 is formed.

The first touch electrodes 311, the second touch electrodes, the second bridge electrodes 322 and the link lines 350 may be formed of a conductive material. For example, the first touch electrodes 311, the second touch electrodes, the second bridge electrodes 322 and the link lines 350 may be formed of a metal. The first touch electrodes 311, the second touch electrodes, the second bridge electrodes 322 and the link lines 350 may be formed simultaneously. For example, the step of forming the first touch electrodes 311, the second touch electrodes, the second bridge electrodes 322 and the link lines 350 may include a step of forming metal material layer on the intermediate insulating layer 400 and a step of patterning the metal material layer.

The first touch electrodes 311, the second touch electrodes and the second bridge electrodes 322 may be formed outside the light-emitting devices 130. For example, each of the second bridge electrodes 322 may include a portion overlapping with one of the first bridge electrodes 312. Thus, in the method of forming the display apparatus according to the embodiment of the present disclosure, the light emitted from each light-emitting device 130 in a direction perpendicular to the surface of the device substrate 110 may be not blocked by the first touch electrodes 311, the second touch electrodes and the second bridge electrodes 322.

Each of the first touch electrodes 311 may be connected to one of the first bridge electrodes 312 passing through the intermediate insulating layer 400. For example, touch contact holes exposing a portion of each first bridge electrode 312 may be formed in the intermediate insulating layer 400, before forming the metal material layer to form the first touch electrodes 311, the second touch electrodes, the second bridge electrode 322 and the link lines 350.

Each of the first touch electrodes 311 and the second touch electrodes may cover an inclined side of one of the optical patterns 510. The first touch electrodes 311 and the second touch electrodes may expose the upper surface of each optical pattern 510. For example, the step of forming the first touch electrodes 311, the second touch electrodes, the second bridge electrodes 322 and the link lines 350 may include a step of removing a portion of the metal material layer which is disposed on a portion of the intermediate insulating layer 400 covering the upper surface of each optical pattern 510. The intermediate insulating layer 400 may have an etch selectivity with the first touch electrodes 311 and the second touch electrodes. Thus, in the method of forming the display apparatus according to the embodiment of the present disclosure, the portion of the intermediate insulating layer 400 covering the upper surface of each optical pattern 510 may be not damaged in a process of patterning the metal material layer.

Each of the first touch electrodes 311 and the second touch electrodes may be connected to one of the touch pads 304 by one of the link lines 350. For example, the link lines 350 may extend along a surface of the cover dam 520. Each of the link lines 350 may be in direct contact with the corresponding touch pads 304 through one of the pad contact holes.

As shown in FIGS. 2 and 3, the method of forming the display apparatus according to the embodiment of the present disclosure may include a step of forming a cover insulating layer 600 on the device substrate 110 in which the first touch electrodes 311, the second touch electrodes, the second bridge electrodes 322 and the link lines 350 are formed.

The cover insulating layer 600 may be formed of an insulating material. For example, the cover insulating layer 600 may be formed of an organic insulating material. The cover insulating layer 600 may be formed at the inside of the cover dam 520. For example, the step of forming the cover insulating layer 600 may include a step of depositing an organic insulating material on the inside of the cover dam 520 using inkjet process. Thus, in the method of forming the display apparatus according to the embodiment of the present disclosure, the degree of freedom for a process of forming the cover insulating layer 600 may be improved.

Accordingly, the method of forming the display apparatus according to the embodiment of the present disclosure may include the step of forming the optical patterns 510 overlapping with the light-emitting devices 130 on the touch buffer layer 200, the step of forming the intermediate insulating layer 400 on the optical patterns 510 and the step of forming the touch electrodes 311 which include the portion overlapping with the inclined side of each optical pattern 510 on the intermediate insulating layer 400. Thus, in the method of forming the display apparatus according to the embodiment of the present disclosure, the light emitted from each light-emitting device 130 toward the inclined side of the corresponding optical pattern 510 may be internally reflected by the touch electrodes 311. Therefore, in the method of forming the display apparatus according to the embodiment of the present disclosure, the light extraction efficiency and the frontal luminance may be improved.

And, in the method of forming the display apparatus according to the embodiment of the present disclosure, the cover dam 520 defining the location of the cover insulating layer 600 which is formed by a subsequent process may be formed simultaneously with the optical patterns 510. Thus, in the method of forming the display apparatus according to the embodiment of the present disclosure, the degree of freedom for a process of forming the cover insulating layer 600 may be improved without adding a process. Therefore, in the method of forming the display apparatus according to the embodiment of the present disclosure, the process efficiency may be improved.

The display apparatus according to the embodiment of the present disclosure and the method of forming the same are described that the encapsulation dam 106 may be formed of a single material. However, in the display apparatus according to another embodiment of the present disclosure and the method of forming the same, the encapsulation dam 106 may have a multi-layer structure. For example, in the display apparatus according to another embodiment of the present disclosure and the method of forming the same, the encapsulation dam 106 may have a stacked structure of a lower dam formed simultaneously with the over-coat layer 113 and an upper dam formed simultaneously with the bank insulating layer 114.

Figure 6:
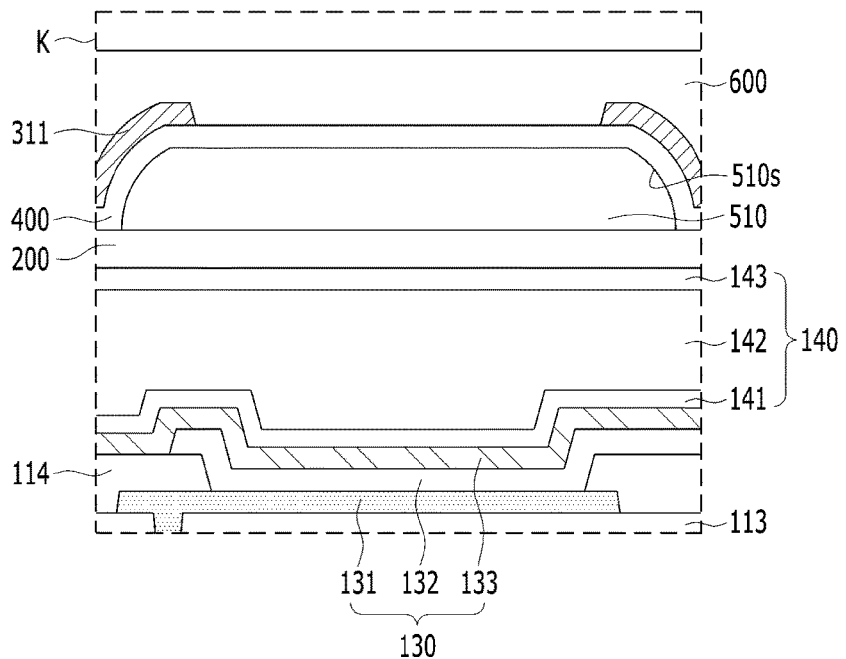
FIGS. 6 and 7 are views respectively showing the display apparatus according another embodiment of the present disclosure.

The display apparatus according to the embodiment of the present disclosure is described that the side 510s of each optical pattern 510 may have a sloped plane shape. However, in the display apparatus according to another embodiment of the present disclosure, the side of each optical pattern 510 may have various shapes. For example, in the display apparatus according to another embodiment of the present disclosure, the side 510s of each optical pattern 510 may have a convex shape toward the outside of the corresponding optical pattern 510, as shown in FIG. 6. Thus, in the display apparatus according to another embodiment of the present disclosure, the light extraction efficiency by the touch electrodes 311 may be effectively improved.

Figure 7:
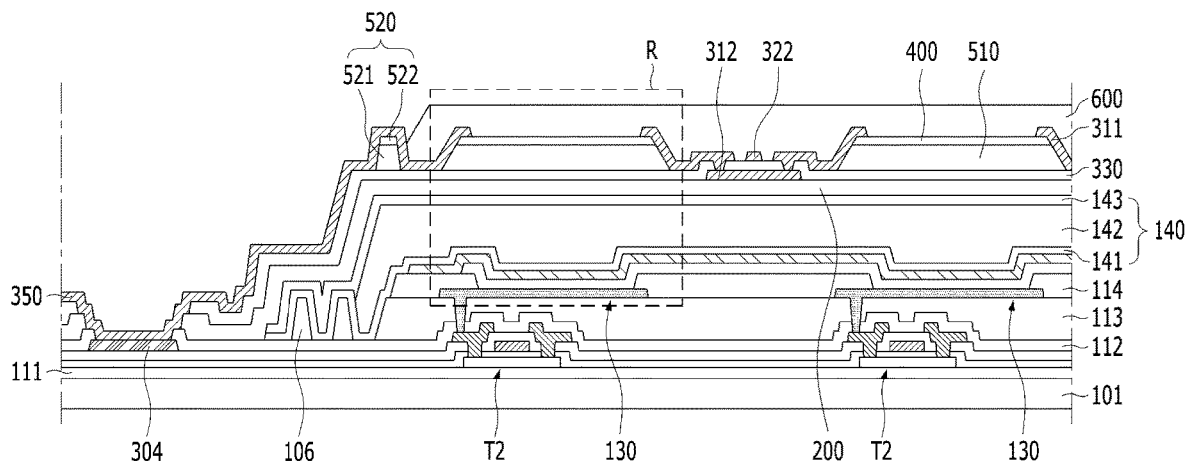
Figure 8:
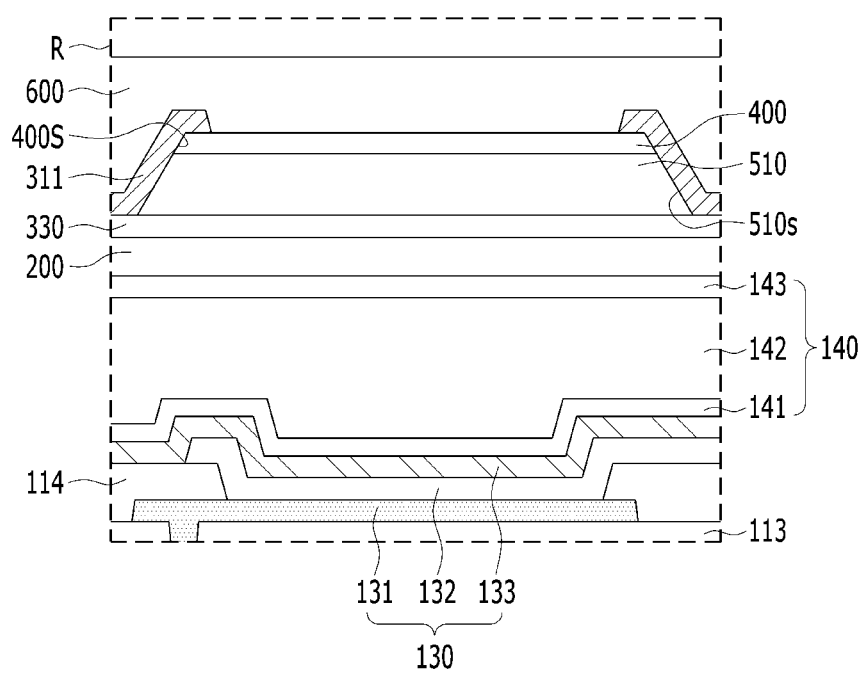
FIG. 8 is an enlarged view of R region in FIG. 7.

The display apparatus according to the embodiment of the present disclosure is described that the intermediate insulating layer 400 may be disposed between the first bridge electrodes 321 and the second bridge electrodes 322. However, in the display apparatus according to another embodiment of the present disclosure, the touch insulating layer 330 between the first bridge electrode 312 and the second bridge electrode 322 may extend between the touch buffer layer 200 and the optical patterns 510, as shown in FIGS. 7 and 8. The intermediate insulating layer 400 may be disposed only on the upper surface of each optical pattern 510 opposite to the device substrate 110. For example, the inclined side 510s of each optical pattern 510 may be in direct contact with one of the touch electrodes 311. Thus, in the display apparatus according to another embodiment of the present disclosure, the degree of freedom for a material of the intermediate insulating layer 400 may be improved. Therefore, in the display apparatus according to another embodiment of the present disclosure, the damage of the intermediate insulating layer 400 due to a process of forming the touch electrodes 311 may be effectively prevented.

The display apparatus according to the embodiment of the present disclosure is described that the cover dam 520 may have a single-layer structure. However, in the display apparatus according to another embodiment of the present disclosure, the cover dam 520 may have a multi-layer structure. For example, in the display apparatus according to another embodiment of the present disclosure, the cover dam 520 may have a stacked structure of a first dam pattern 521 and a second dam pattern 522, as shown in FIGS. 7 and 8. The first dam pattern 521 may include the same material as the optical patterns 510. The second dam pattern 522 may include the same material as the intermediate insulating layer 400. Thus, in the display apparatus according to another embodiment of the present disclosure, the location of the cover insulating layer 600 which is formed by a subsequent process may be effectively defined. Therefore, in the display apparatus according to another embodiment of the present disclosure, the degree of freedom for a process of forming the cover insulating layer 600 may be effectively improved.

Figure 9A:
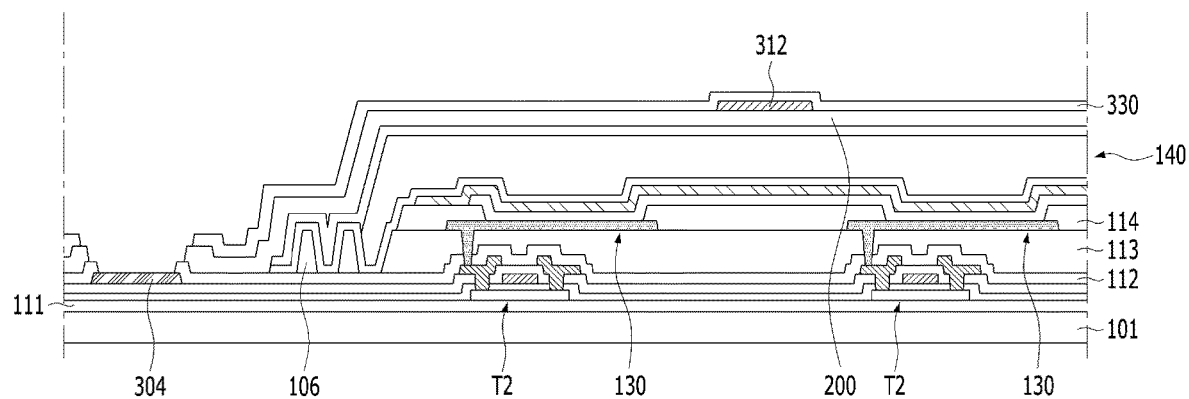
FIGS. 9A and 9B are views sequentially showing a method of forming the display apparatus according to another embodiment of the present disclosure.
Figure 9B:
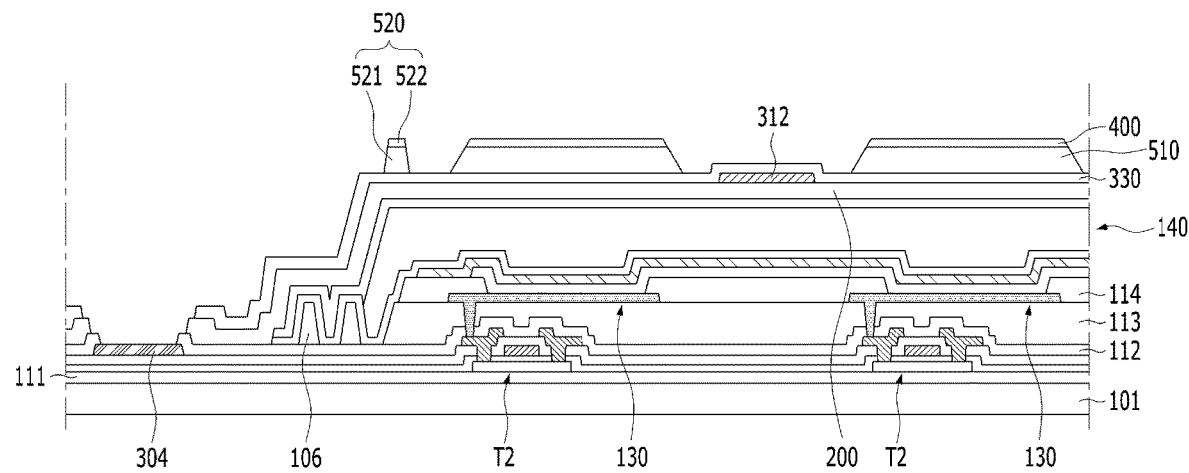

FIGS. 9A and 9B are views sequentially showing a method of forming the display apparatus according to another embodiment of the present disclosure.

A method of forming the display apparatus according to another embodiment of the present disclosure will be described with reference to FIGS. 7, 8, 9A and 9B. First, as shown in FIG. 9A, the method of forming the display apparatus according to another embodiment of the present disclosure may include a step of a device buffer layer 111 on a device substrate 110, a step of forming driving circuits including a second thin film transistor T2 and pads including touch pads 304 on the device substrate 110 in which the device buffer layer 111 is formed, a step of forming a lower passivation layer 112 on the device substrate 110 in which the driving circuits and the pads, a step of forming an over-coat layer 113 and at least one encapsulation dam 106 on the lower passivation layer 112, a step of forming light-emitting devices 130 and a bank insulating layer 114 on the over-coat layer 113, a step of forming encapsulating element 140 covering the light-emitting devices 130 and the bank insulating layer 114 on the device substrate 110, a step of forming a touch buffer layer 200 on the encapsulating element 140, a step of forming first bridge electrodes 312 on the touch buffer layer 200, and a step of forming a touch insulating layer 330 covering the first bridge electrodes 312.

The touch insulating layer 330 may be formed of an insulating material. For example, the touch insulating layer 330 may be formed on an inorganic insulating material, such as silicon oxide (SiO) and silicon nitride (SiN).

As shown in FIG. 9B, the method of forming the display apparatus according to another embodiment of the present disclosure may include a step of forming optical patterns 510, an intermediate insulating layer 400 covering an upper surface of each optical pattern 510 opposite to the device substrate 110 and a cover dam 520.

The optical patterns 510, the intermediate insulating layer 400 and the cover dam 520 may be formed by the same process. For example, the step of forming the optical patterns 510, the intermediate insulating layer 400 and the cover dam 520 may include a step of stacking an organic insulating material layer and an inorganic insulating material layer on the touch insulating layer 330, and a step of sequentially patterning the organic insulating material layer and the inorganic insulating material layer. For example, a side 400s of the intermediate insulating layer 400 may be continuously with a side 510s of the corresponding optical pattern 510. A thickness of the cover dam 520 may be the same as the sum of a thickness of each optical pattern 510 and a thickness of the intermediate insulating layer 400. Thus, in the method of forming the display apparatus according to another embodiment of the present disclosure, the degree of freedom for a material of the intermediate insulating layer 400 may be improved.

As shown in FIGS. 7 and 8, the method of forming the display apparatus according to another embodiment of the present disclosure may include a step of forming first touch electrodes 311, second touch electrodes and second bridge electrodes 322 on the device substrate 110 in which the optical patterns 510, the intermediate insulating layer 400 and the cover dam 520 are formed, and a step of forming a cover insulating layer 600 on the inside of the cover dam 520.

Accordingly, the method of forming the display apparatus according to another embodiment of the present disclosure may include the step of forming the optical patterns 510 and the intermediate insulating layer 400 on the touch insulating layer 330 covering the first bridge electrodes 312. Thus, in the method of forming the display apparatus according to another embodiment of the present disclosure, the degree of freedom for a material of the intermediate insulating layer 400 may be improved. That is, in the display apparatus according to another embodiment of the present disclosure, the second bridge electrodes 322 may be sufficiently insulated from the first bridge electrodes 312 and the damage of the portion of the intermediate insulating layer 400 due to a process of forming the touch electrodes 311 may be prevented. Therefore, in the display apparatus according to another embodiment of the present disclosure, the process efficiency and the light extraction efficiency may be improved.

In the result, the display apparatus according to the embodiments of the present disclosure may include an optical pattern on a light-emitting device and an intermediate insulating layer covering a surface of the optical pattern opposite to the light-emitting device, wherein the intermediate insulating layer may be harder than the optical pattern, and wherein a touch electrode may be disposed on a side of the optical pattern. Thus, in the display apparatus according to the embodiments of the present disclosure, the damage of the surface of the optical pattern opposite to the light-emitting device due to a process of forming the touch electrode may be prevented. Thereby, in the display apparatus according to the embodiments of the present disclosure, the viewing angle may be restricted and the quality of the image may be improved.

What is claimed is:

1. A display apparatus comprising:
    a light-emitting device including a first electrode, a light-emitting layer and a second electrode, which are sequentially stacked on a device substrate;
    a bank insulating layer on the device substrate, the bank insulating layer covering an edge of the first electrode;
    an encapsulating element disposed on the device substrate, the encapsulating element covering the light-emitting device and the bank insulating layer;
    an optical pattern including a lower surface, an upper surface on the lower surface and inclined side surfaces that extend from the lower surface to the upper surface, the lower surface and the upper surface of the optical pattern overlapping with a portion of the first electrode exposed by the bank insulating layer in a direction perpendicular to the device substrate;
an intermediate insulating layer on the upper surface of the optical pattern, the intermediate insulating layer having a hardness greater than the optical pattern; and
a touch structure including a touch electrode and a bridge electrode electrically connected to the touch electrode, the touch electrode and the bridge electrode overlapping with the bank insulating layer outside the portion of the first electrode exposed by the bank insulating layer,
wherein a horizontal width of the upper surface of the optical pattern is less than a horizontal width of the lower surface of the optical pattern,
wherein the inclined side surfaces of the optical pattern overlap the bank insulating layer in the direction perpendicular to the device substrate,
wherein a portion of the intermediate insulating layer overlapping with the upper surface of the optical pattern is exposed by the touch electrode,
wherein the touch electrode includes an inclined portion corresponding to the inclined side surfaces of the optical pattern and disposed on the inclined side surfaces of the optical pattern, and
wherein the inclined side surfaces of the optical pattern are spaced away from the bridge electrode in a direction parallel to the device substrate.

2. The display apparatus according to claim 1, wherein the intermediate insulating layer is in contact with the upper surface of the optical pattern which is opposite to the device substrate.

3. The display apparatus according to claim 1, wherein a refractive index of the intermediate insulating layer is smaller than a refractive index of the optical pattern.

4. The display apparatus according to claim 3, wherein the optical pattern includes an organic insulating material, and wherein the intermediate insulating layer includes an inorganic insulating material.

5. The display apparatus according to claim 3, further comprising a cover insulating layer on the intermediate insulating layer and the touch electrode,
wherein the refractive index of the cover insulating layer is smaller than the refractive index of the intermediate insulating layer.

6. The display apparatus according to claim 1, wherein each of the inclined side surfaces of the optical pattern has a convex shape toward an outside of the optical pattern.

7. The display apparatus according to claim 1, further comprising:
a touch pad on the device substrate, the touch pad being spaced away from the encapsulating element; and
a cover dam on the upper surface of the encapsulating element between the light-emitting device and the touch pad,
wherein the cover dam includes a same material as the optical pattern.

8. The display apparatus according to claim 1, wherein the bridge electrode is spaced away from the optical pattern,
wherein the intermediate insulating layer extends on the bridge electrode, and
wherein the touch electrode is connected to the bridge electrode by penetrating the intermediate insulating layer.

9. A display apparatus comprising:
a light-emitting device including a first electrode, a light-emitting layer and a second electrode, which are sequentially stacked on a device substrate;
a bank insulating layer on the device substrate, the bank insulating layer covering an edge of the first electrode;
an optical pattern on the light-emitting device and the bank insulating layer, the optical pattern including a lower surface, an upper surface on the lower surface and inclined side surfaces that extend from the lower surface to the upper surface, the lower surface and the upper surface of the optical pattern overlapping with a portion of the first electrode exposed by the bank insulating layer in a direction perpendicular to the device substrate;
an intermediate insulating layer on the upper surface of the optical pattern which is opposite to the light-emitting device; and
a touch structure including a touch electrode and a bridge electrode electrically connected to the touch electrode, the touch electrode and the bridge electrode overlapping with the bank insulating layer outside the portion of the first electrode exposed by the bank insulating layer,
wherein the intermediate insulating layer includes a material different from the touch electrode,
wherein the upper surface of the optical pattern has a horizontal width less than the lower surface of the optical pattern,
wherein the inclined side surfaces of the optical pattern overlaps the bank insulating layer in the direction perpendicular to the device substrate,
wherein a portion of the intermediate insulating layer overlapping with the upper surface of the optical pattern is exposed by the touch electrode,
wherein the touch electrode includes an inclined portion corresponding to the inclined side surfaces of the optical pattern and disposed on the inclined side surfaces of the optical pattern, and
wherein the inclined side surfaces of the optical pattern are spaced away from the bridge electrode in a direction parallel to the device substrate.

10. The display apparatus according to claim 9, wherein the touch electrode includes an end which is disposed on the intermediate insulating layer.

11. The display apparatus according to claim 9, wherein the touch electrode is in contact with one of the inclined side surfaces of the optical pattern.

12. The display apparatus according to claim 11, further comprising:
an encapsulating element disposed between the light-emitting device and the optical pattern and between the bank insulating layer and the optical pattern;
a touch insulating layer on the bridge electrode, the touch insulating layer extending between the encapsulating element and the optical pattern,
wherein the bridge electrode is spaced away from the optical pattern,
wherein the touch insulating layer includes a touch contact hole exposing a portion of the bridge electrode, and
wherein the touch electrode is connected to the bridge electrode through the touch contact hole.

13. The display apparatus according to claim 9, further comprising:
a cover insulating layer on the intermediate insulating layer and the touch electrode;

a touch pad on the device substrate, the touch pad being spaced away from the cover insulating layer;

a cover dam disposed between the touch pad and the cover insulating layer; and a link line connecting the touch electrode to the touch pad by extending along a surface of the cover dam, wherein the cover dam has a stacked structure of a first dam pattern including a same material as the optical pattern, and a second dam pattern including a same material as the intermediate insulating layer.

14. The display apparatus according to claim 13, wherein a thickness of the first dam pattern is a same as a thickness of the optical pattern, and wherein the thickness of the second dam pattern is a same as a thickness of the intermediate insulating layer.

15. The display apparatus according to claim 13, wherein a side of the first dam pattern has an inclination angle different from the inclined side surfaces of the optical pattern.

* * * * *